United States Patent
Shappir

(10) Patent No.: US 6,975,541 B2
(45) Date of Patent: Dec. 13, 2005

(54) ALTERNATING APPLICATION OF PULSES ON TWO SIDES OF A CELL

(75) Inventor: Assaf Shappir, Modein (IL)

(73) Assignee: Saifun Semiconductors LTD, Netanya (IL)

( * ) Notice: Subject to any disclaimer, the term of this patent is extended or adjusted under 35 U.S.C. 154(b) by 0 days.

(21) Appl. No.: 10/394,254

(22) Filed: Mar. 24, 2003

(65) Prior Publication Data

US 2004/0190341 A1 Sep. 30, 2004

(51) Int. Cl.$^7$ .............................................. G11C 16/06
(52) U.S. Cl. ........................... 365/185.22; 365/185.03; 365/185.24
(58) Field of Search ................... 365/185.03, 185.19, 365/185.22, 185.24, 185.28, 185.29

(56) References Cited

U.S. PATENT DOCUMENTS

| | | | | |
|---|---|---|---|---|
| 6,011,725 A | * | 1/2000 | Eitan | 365/185.33 |
| 6,215,702 B1 | * | 4/2001 | Derhacobian et al. | 365/185.29 |
| 6,307,784 B1 | * | 10/2001 | Hamilton et al. | 365/185.22 |
| 6,320,786 B1 | * | 11/2001 | Chang et al. | 365/185.03 |
| 6,348,711 B1 | | 2/2002 | Eitan | |
| 6,396,741 B1 | * | 5/2002 | Bloom et al. | 365/185.22 |
| 6,614,692 B2 | * | 9/2003 | Eliyahu et al. | 365/185.29 |
| 6,643,170 B2 | * | 11/2003 | Huang et al. | 365/185.03 |
| 6,643,181 B2 | * | 11/2003 | Sofer et al. | 365/185.22 |
| 2002/0159293 A1 | | 10/2002 | Hamilton et al. | |

OTHER PUBLICATIONS

European Search Report for EP 04 007003.

* cited by examiner

*Primary Examiner*—Son Mai
(74) *Attorney, Agent, or Firm*—Eitan Law Group

(57) ABSTRACT

A method for operating on bits of a memory cell, the method comprising providing a memory cell that has two separated and separately chargeable areas on first and second sides of the cell, each chargeable area defining one bit, applying an injection pulse and a verify pulse on the first side of the cell, and before the first side of the cell has reached a verify level, applying an injection pulse and a verify pulse on the second side of the cell.

16 Claims, 2 Drawing Sheets

ALTERNATING APPLICATION OF PULSES ON TWO SIDES OF A CELL

FIELD OF THE INVENTION

The present invention relates generally to operating memory cells of non-volatile memory (NVM) arrays, such as programming and erasing, and particularly to methods for reducing pulse operations of such arrays.

BACKGROUND OF THE INVENTION

Non-volatile memory (NVM) cells, such as those used in erasable, programmable read only memories (EPROMs), electrically erasable, programmable read only memories (EEPROMs), and flash EEPROM memories, generally may have one single chargeable area.

Another type of non-volatile cell, called a nitride, read only memory (NROM) cell, may have two separated and separately chargeable areas, each defining one bit. The separately chargeable areas are found within a nitride layer formed in an oxide-nitride-oxide (ONO) stack underneath the gate. The ONO stack may overlie a channel situated between a pair of bit lines. In order to program a bit, channel hot electrons (CHE) are injected into the nitride layer. This is generally accomplished by the application of a positive gate voltage and positive drain voltage, the magnitude and duration of which are determined by different factors related to the amount of programming required.

Erasing a bit is generally accomplished by the application of a negative gate voltage and positive drain voltage, the magnitude and duration of which are determined by different factors related to the amount of erasing required. Different types of erasing mechanisms may be used to erase bits in NROM cells. One technique is hot hole injection, described for example in U.S. Pat. No. 6,348,711, the disclosure of which is incorporated herein by reference. In this technique, application of an erase voltage to a bit line may create holes by band-to-band tunneling in the junction of the bit line with the channel. A lateral field in the area of the junction surface may accelerate the holes such that they become hot holes. A vertical field generated by the negative gate voltage then pulls the hot holes into the nitride layer.

Charge injection, whether CHE injection or hot hole injection, must be controlled to insure proper device operation. In general, step and verify algorithms are implemented, wherein charge is injected at a certain bias (voltage level) followed by a verify operation to ascertain whether the bit has reached a desired voltage level (e.g., program verify or erase verify voltage level). If the desired voltage verify level has not been achieved, stronger charge injection may be initiated via a higher bias and vice versa.

However, in tunneling-enhanced hot hole injection, the other junction in the transistor, to which holes are not injected, should remain unbiased as possible, in order to prevent possible "punch through", i.e., contact of the two junction depletion regions, which may slow down the charge injection process, due to the decrease of the junction lateral field. Thus, in NROM cells that comprise two physical bits per cell, and which incorporate a tunneling-enhanced hot hole injection mechanism, hole injection may not be performed simultaneously on both sides of the memory cell. This prolongs the time it takes to carry out the injection operation, and the time is prolonged even more by the step and verify algorithms. It would thus be desirable to reduce the time needed to perform the injection operation.

One option to enhance the hole injection flow may involve using relatively large voltage increments between consecutive steps of the step and verify algorithm. However, the large voltage increments may result in bad control over the injection process.

Another solution involves applying relatively large voltage increments between initial steps of the step and verify algorithm for many cells in parallel, until a first cell or selected group of cells reaches a target. The rest of the memory array is then programmed/erased with smaller increments until the full array is done.

Yet another technique samples a small amount of cells in the array to determine their behavior characteristics upon the application of pulses to program or erase. After learning how the threshold voltage changes in accordance with the pulses, the rest of the array may be programmed (or erased) en masse with a significantly reduced number of pulses and verifies.

Still another method employs multiple verify levels in an effort to obtain a faster convergence to the final pulse level. However, this method may require a more intricate design and a longer verify time.

In all of the prior art methods, each programming/erasing step is performed on both the right and left side of the memory cells. Accordingly, the basic time penalty of having to finish one side before applying pulses to the other side has not yet been circumvented.

SUMMARY OF THE INVENTION

The present invention seeks to provide methods for operating (programming or erasing) bits of memory cells in memory arrays, and for reducing pulse operations of such arrays. The invention is described in detail hereinbelow with reference to memory cells of NVM arrays, and particularly to two-bit or multi-bit NROM cells. However, it should be emphasized that the invention is not limited to NROM cells. Rather, the present invention is applicable for any non-volatile cell that has two or more physically decoupled chargeable areas. The invention may also be applicable to single bit cells, e.g., if there is a limit to the amount of cells that can be operated simultaneously, yet it is desired to converge on all cells as fast as possible.

As mentioned above, the prior art comprises repeating voltage step and verify cycles (each cycle comprising a separate injection pulse and a separate verify pulse) on only one side of the cell (left or right) until the desired voltage verify level has been achieved, and then repeatedly applying the voltage step and verify cycles on the other side of the cell (right or left, respectively). In contrast, in one embodiment of the invention, the voltage step and verify cycles are alternatively applied to both sides of the cell. For example, a first voltage step and verify cycle may be applied on one side of the cell, the next voltage step and verify cycle may be applied on the other side of the cell, and so on, alternating between sides of the cell. In this manner, the voltage step and verify cycle time may be reduced by up to 50%. Embodiments of the invention are described more in detail hereinbelow.

There is thus provided in accordance with an embodiment of the invention a method for operating bits of memory cells in a memory array, the method including providing a memory cell that has two separated and separately chargeable areas on first and second sides of the cell, each chargeable area defining one bit, applying an injection pulse and a verify pulse on the first side of the cell, and before the first side of the cell has reached a verify level, applying an injection pulse and a verify pulse on the second side of the cell. Afterwards, another injection pulse and another verify pulse may be applied on the first side of the cell before the second side of the cell has reached a verify level.

In accordance with an embodiment of the invention, the method may further comprise applying injection pulses and verify pulses alternatively on the first side of the cell and on the second side of the cell until both sides of the cell have reached a verify level.

Further in accordance with an embodiment of the invention, the method may comprise applying injection pulses and verify pulses in two modes of operation, wherein in a first mode of operation, the injection pulses and verify pulses are alternatively applied on the first and second sides of the cell, and wherein in a second mode of operation, the injection pulses and verify pulses are applied on both sides of the cell until both sides of the cell have reached a verify level.

Alternatively in accordance with an embodiment of the invention, the method may comprise applying injection pulses and verify pulses in two modes of operation, wherein in a first mode of operation, the injection pulses and verify pulses are alternatively applied on the first and second sides of the cell, and wherein in a second mode of operation, the injection pulses and verify pulses are applied on only one of the first and second sides of the cell, until after a combination of both modes of operation, both sides of the cell have reached a verify level.

Still further in accordance with an embodiment of the invention, the method may comprise changing the injection pulse and/or the verify pulse before applying the pulse on one of the sides of the cell (e.g., changing a voltage magnitude and/or time duration of the pulse).

There is also provided in accordance with an embodiment of the invention a method for operating bits of a memory cell, the method comprising providing a memory array comprising cells that have chargeable areas, each chargeable area defining one bit, applying an injection pulse and a verify pulse to a first subset of the cells, and before the first subset of the cells has reached a verify level, applying an injection pulse and a verify pulse to a second subset of the cells.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
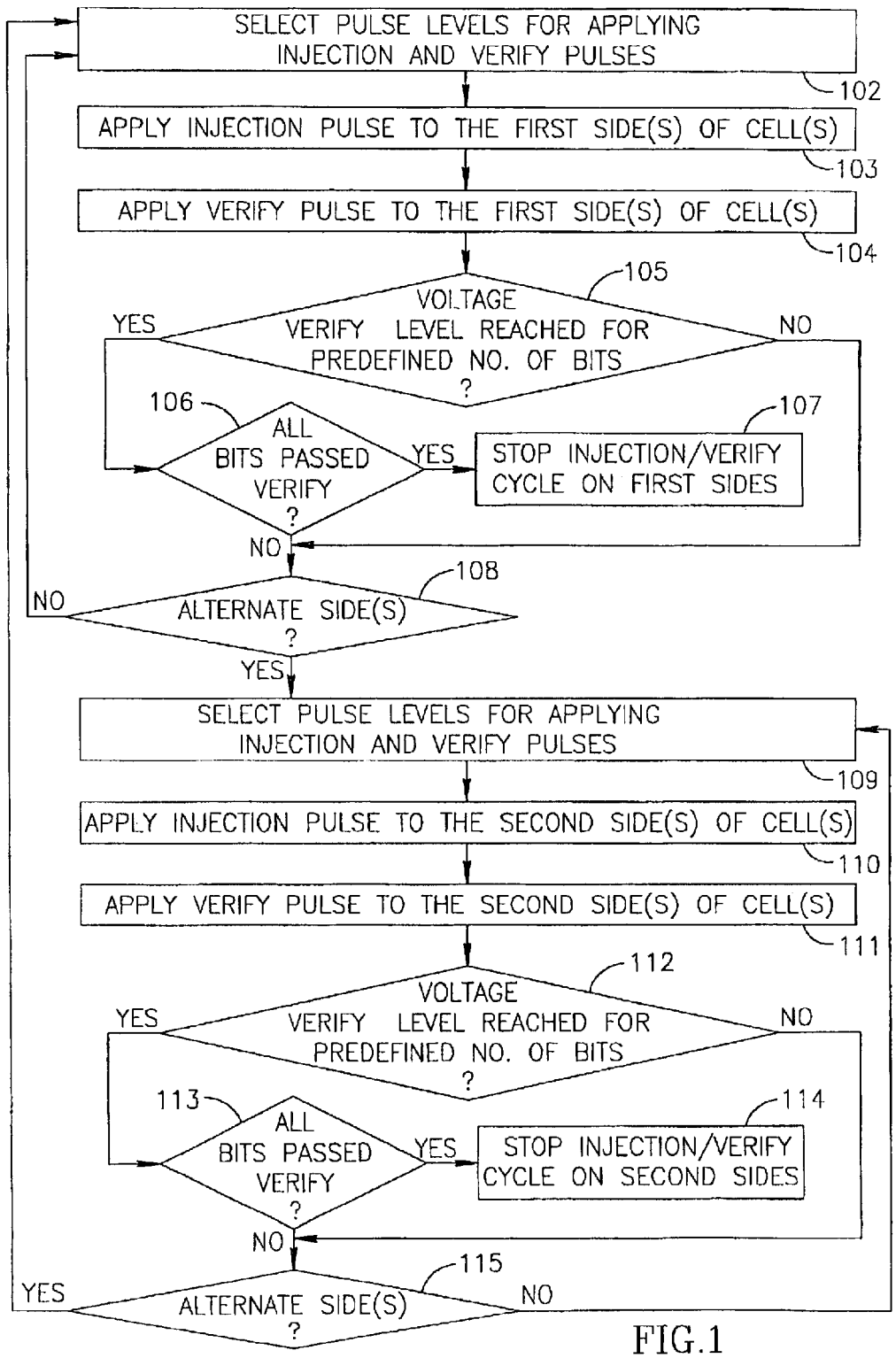
FIG. 1 is a simplified flow chart of a method for performing injection/verify cycles (e.g., for programming or erasing) on bits of memory cells in a non-volatile memory cell array, in accordance with an embodiment of the present invention.

Reference is now made to FIG. 1, which illustrates a method for performing injection/verify cycles on bits of memory cells in a non-volatile memory cell array, in accordance with an embodiment of the present invention, wherein the memory cells have two separated and separately chargeable areas, each defining one bit. For example, the method may be used to erasing bits of nitride, read only memory (NROM) cells with hot hole injection. The method may also be used to program bits of NROM cells with channel hot electron (CHE) injection.

In one embodiment of the invention, the method comprises an "alternative mode", wherein the voltage step and verify cycles are alternatively applied to both sides of the cell. Pulse levels (voltage levels) may be selected for applying injection and verify pulses (step 102 in FIG. 1). An injection pulse may be applied to the first side(s) of cell(s) (step 103), followed by a verify pulse to the first side(s) of cell(s) (step 104), for verifying if a voltage verify level (e.g., program or erase) has been reached (step 105). By "voltage verify level" it is meant if the threshold voltage associated with the bit has reached a predefined level.

If the voltage verify level has been reached for a predefined number of bits, the method may check if all the bits have passed the verification test (step 106). If all the bits have passed the verification test (e.g., they have all been programmed or erased), then the injection/verify cycle may be stopped (step 107) and the method may continue for the second side(s) of the cell(s). FIG. 1 illustrates a simplified flow chart that stops the cycle after reaching a certain verify level. However, alternatively, one or more additional injection/verify cycles may be performed until another voltage threshold level has been reached.

If all the bits have not yet passed the verification test, or if the voltage verify level has not yet been reached for a predefined number of bits, the method provides for the option (step 108) of temporarily suspending the alternative mode and re-applying the injection and verify pulses to the first side(s) of the cell(s) (steps 102–107). The pulse levels may be changed, if desired, in step 102. Changing the pulse level may comprise changing the magnitudes of the voltages applied on the gate and/or drain and/or changing the time duration of the pulse.

If the alternative mode is still on, then the method switches to the second side(s) of the cell(s).

Pulse levels (voltage levels) may be selected for applying injection and verify pulses to the second side(s) of the cell(s) (step 109). An injection pulse may be applied to the second side(s) of cell(s) (step 110), followed by a verify pulse to the second side(s) of cell(s) (step 111), for verifying if a voltage verify level (e.g., program or erase) has been reached (step 112).

If the voltage verify level has been reached for a predefined number of bits, the method may check if all the bits have passed the verification test (step 113). If all the bits have passed the verification test (e.g., they have all been programmed or erased), then the injection/verify cycle may be stopped (step 114) and the process is completed.

If all the bits have not yet passed the verification test, or if the voltage verify level has not yet been reached for a predefined number of bits, the method provides for the option (step 115) of temporarily suspending the alternative mode and re-applying the injection and verify pulses to the second side(s) of the cell(s) (steps 109–114). The pulse levels may be changed, if desired, in step 109.

If the alternative mode is still on, then the method switches back to the first side(s) of the cell(s), and the process is repeated. Again, the pulse levels may be changed before any application of injection or verify pulse.

Figure 2:
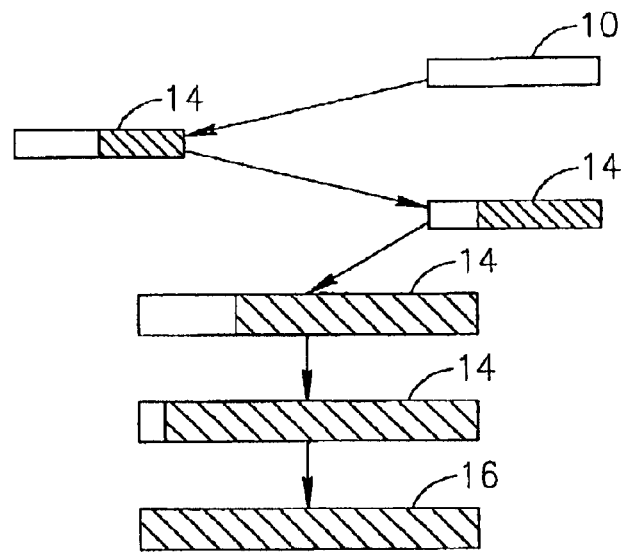
FIG. 2 is a simplified illustration of bits of two sides of memory cells being injected and verified in alternative fashion, in accordance with an embodiment of the present invention.

Reference is now made to FIG. 2, which illustrates one implementation of injecting and verifying bits of two sides of memory cells in alternative fashion, in accordance with an embodiment of the present invention. In this example, a first voltage step and verify cycle may be applied on the right sides of cells of a memory array (as indicated by reference numeral 10), and the next voltage step and verify cycle may be applied on the left sides of the cells (reference numeral 12). The initial pulses may be incremented in relatively large voltage increments. Once a first subset of right or left bits has reached a verification target (as indicated by the shaded area 14), the alternative mode may be suspended and repetitive cycles of separate injection pulses and separate verify pulses may be applied on both the right and left sides of the memory cells until the desired voltage verify level has been achieved. Smaller voltage increments may be used in the later stages of the method. The method continues until all the bits have been injected and passed verification (as indicated by the shaded area 16).

Once the first bit of one side of a particular cell (or group of bits of a particular portion of the memory array) is programmed/erased, the bit of the other side of the cell (or groups of bits on the other sides of the cells) may receive the same pulse, in order to prevent charge over injection.

Figure 3:
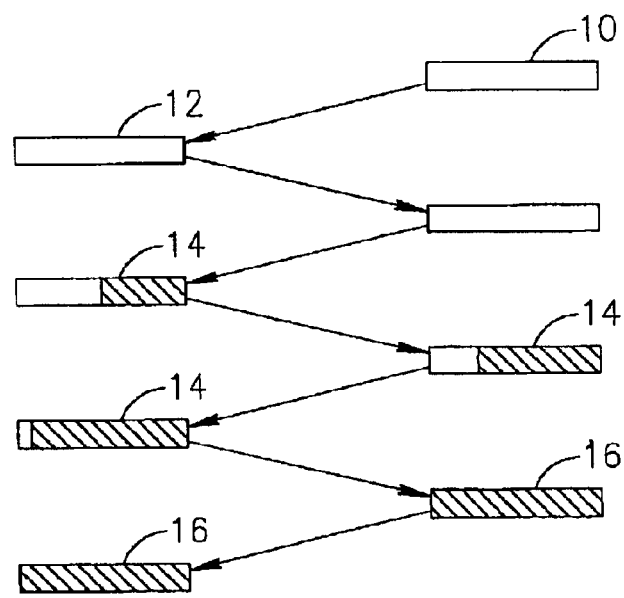
FIG. 3 is a simplified illustration of bits of two sides of memory cells being injected and verified in alternative fashion, in accordance with another embodiment of the present invention.

Reference is now made to FIG. 3, which illustrates another implementation of injecting and verifying bits of two sides of memory cells in alternative fashion, in accordance with another embodiment of the present invention. In this example, the alternative mode is implemented from start to finish until all the bits have been injected and passed verification. Again, the pulse levels may be changed before any application of injection or verify pulse. For example, the initial pulses may be incremented in relatively large voltage increments, whereas smaller voltage increments may be used in the later stages of the method. The invention is of course not limited to these examples. For example, after applying injection pulses and verify pulses in an alternative fashion on the first and second sides of said cell, the injection pulses and verify pulses may be applied on only one of the first and second sides of the cell, until after a combination of both modes of operation, both sides of the cell have reached a verify level.

As another example, the invention may be carried out with single bit cells of a memory array. In such a case, instead of alternating the injection pulses and the verify pulses between the left and right sides of a double-bit cell, the memory array may be partitioned into a first subset and a second subset of cells (as similarly indicated by reference numerals 10 and 12 in FIGS. 2 and 3), and the injection pulses and the verify pulses may be alternated between the two subsets of cells, as described hereinabove.

It will be appreciated by persons skilled in the art that the present invention is not limited by what has been particularly shown and described hereinabove. Rather the scope of the present invention includes both combinations and subcombinations of the features described hereinabove as well as modifications and variations thereof which would occur to a person of skill in the art upon reading the foregoing description and which are not in the prior art.

What is claimed is:

1. A method for operating bits of a memory cell, the method comprising:
   providing a memory cell that has two separated and separately chargeable areas on first and second sides of the cell, each chargeable area defining one bit;
   applying an injection pulse and a verify pulse on the first side of said cell; and
   before the first side of said cell has reached a verify level, applying an injection pulse and a verify pulse on the second side of said cell.

2. The method according to claim 1, further comprising applying another injection pulse and another verify pulse on the first side of said cell before the second side of said cell has reached a verify level.

3. The method according to claim 1, further comprising applying injection pulses and verify pulses alternatively on the first side of said cell and on the second side of said cell until both sides of said cell have reached a verify level.

4. The method according to claim 1, further comprising applying injection pulses and verify pulses in two modes of operation, wherein in a first mode of operation, the injection pulses and verify pulses are alternatively applied on the first and second sides of said cell, and wherein in a second mode of operation, the injection pulses and verify pulses are applied on both sides of said cell until both sides of said cell have reached a verify level.

5. The method according to claim 1, further comprising applying injection pulses and verify pulses in two modes of operation, wherein in a first mode of operation, the injection pulses and verify pulses are alternatively applied on the first and second sides of said cell, and wherein in a second mode of operation, the injection pulses and verify pulses are applied on only one of the first and second sides of said cell, until after a combination of both modes of operation, both sides of said cell have reached a verify level.

6. The method according to claim 1, further comprising changing at least one of said injection pulse and said verify pulse before applying said pulse on one of the sides of said cell.

7. The method according to claim 6, wherein changing at least one of said injection pulse and said verify pulse comprises changing a voltage magnitude of said pulse.

8. The method according to claim 6, wherein changing at least one of said injection pulse and said verify pulse comprises changing a time duration of said pulse.

9. A method for operating bits of a memory cell, the method comprising:
   providing a memory array comprising cells that have chargeable areas, each chargeable area defining one bit;
   applying an injection pulse and a verify pulse to a first subset of said cells; and
   before the first subset of said cells has reached a verify level, applying an injection pulse and a verify pulse to a second subset of said cells.

10. The method according to claim 9, further comprising applying another injection pulse and another verify pulse to the first subset of said cells before the second subset of said cells has reached a verify level.

11. The method according to claim 9, further comprising applying injection pulses and verify pulses alternatively on the first subset of said cells and on the second subset of said cells until both subsets of said cells have reached a verify level.

12. The method according to claim 9, further comprising applying injection pulses and verify pulses in two modes of operation, wherein in a first mode of operation, the injection pulses and verify pulses are alternatively applied on the first and second subsets of said cells, and wherein in a second mode of operation, the injection pulses and verify pulses are applied on both subsets of said cells until both subsets of said cells have reached a verify level.

13. The method according to claim 9, further comprising applying injection pulses and verify pulses in two modes of operation, wherein in a first mode of operation, the injection pulses and verify pulses are alternatively applied on the first and second subsets of said cells, and wherein in a second mode of operation, the injection pulses and verify pulses are applied on only one of the first and second subsets of said cells, until after a combination of both modes of operation, both subsets of said cells have reached a verify level.

14. The method according to claim 9, further comprising changing at least one of said injection pulse and said verify pulse before applying said pulse on one of the subsets of said cells.

15. The method according to claim 14, wherein changing at least one of said injection pulse and said verify pulse comprises changing a voltage magnitude of said pulse.

16. The method according to claim 14, wherein changing at least one of said injection pulse and said verify pulse comprises changing a time duration of said pulse.

* * * * *